(12) United States Patent
Antonyan

(10) Patent No.: US 11,217,305 B2
(45) Date of Patent: Jan. 4, 2022

(54) NONVOLATILE MEMORY DEVICE AND OPERATING METHOD

(71) Applicant: SAMSUNG ELECTRONICS CO., LTD., Suwon-si (KR)

(72) Inventor: Artur Antonyan, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 3 days.

(21) Appl. No.: 17/007,594

(22) Filed: Aug. 31, 2020

(65) Prior Publication Data

US 2021/0264974 A1 Aug. 26, 2021

(30) Foreign Application Priority Data

Feb. 25, 2020 (KR) ........................ 10-2020-0023031

(51) Int. Cl.
*G11C 11/00* (2006.01)
*G11C 16/04* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0038* (2013.01); *G11C 13/0061* (2013.01); *G11C 13/0064* (2013.01); *G11C 13/0069* (2013.01)

(58) Field of Classification Search
CPC ..... G11C 8/08; G11C 11/419; G11C 13/0069; G11C 29/028; G11C 5/145; G11C 5/147; G11C 7/22; G11C 11/1675; G11C 11/412; G11C 13/0028; G11C 11/1659; G11C 7/04; G11C 11/1697; G11C 11/1657; G11C 11/413; G11C 11/418; G11C 2029/1202; G11C 13/003; G11C 13/0038; G11C 7/1096

See application file for complete search history.

(56) References Cited

U.S. PATENT DOCUMENTS

| | | | |
|---|---|---|---|
| 7,508,698 B2 | 3/2009 | Houston | |
| 7,924,633 B2 | 4/2011 | Behrends et al. | |
| 8,009,457 B2 | 8/2011 | Li et al. | |
| 8,724,373 B2 | 5/2014 | Garg et al. | |
| 8,908,439 B2 | 12/2014 | Lin et al. | |
| 9,111,625 B2 | 8/2015 | Ong | |
| 9,711,203 B2 | 7/2017 | Antonyan | |
| 2017/0125091 A1* | 5/2017 | Yoon | G11C 16/3404 |
| 2018/0358063 A1 | 12/2018 | Chen | |
| 2019/0392908 A1* | 12/2019 | Lee | G11C 16/3422 |
| 2020/0098398 A1* | 3/2020 | Mohr | H02M 3/07 |
| 2020/0402564 A1* | 12/2020 | Piccardi | G11C 16/26 |

* cited by examiner

*Primary Examiner* — Hien N Nguyen
(74) *Attorney, Agent, or Firm* — Volentine, Whitt & Francos, PLLC

(57) ABSTRACT

A nonvolatile memory device includes; a memory cell array including memory cells connected with bit lines and feedback cells connected with feedback bit lines, a row decoder connected with the memory cells and the feedback cells through word lines, a column decoder connected with the memory cells through the bit lines and connected with the feedback cells through the feedback bit lines, and a charge pump that generates a pump voltage provided to a selected word line among the word lines, wherein the charge pump is controlled in response to feedback currents flowing through the feedback bit lines.

20 Claims, 12 Drawing Sheets

NONVOLATILE MEMORY DEVICE AND OPERATING METHOD

CROSS-REFERENCE TO RELATED APPLICATIONS

This application claims priority under 35 U.S.C. § 119 to Korean Patent Application No. 10-2020-0023031 filed on Feb. 25, 2020 in the Korean Intellectual Property Office, the subject matter of which is hereby incorporated by reference.

BACKGROUND

Embodiments of the inventive concept relate generally to semiconductor devices, and more particularly to nonvolatile memory devices providing improved reliability, reduced power consumption and a reduced size. Embodiments of the inventive concept relate to operating methods for nonvolatile memory devices.

Nonvolatile memory devices retain stored data even in the absence of applied power. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc.

Power consumption is an important consideration in the design and operation of nonvolatile memory devices, particularly when incorporated into portable electronic devices. To reduce overall power consumption, the level of external power supply voltage(s) provided to nonvolatile memory devices is decreasing. However, certain operations (e.g., read and/or write operations) performed by a nonvolatile memory device may require one or more internal voltage(s) that are higher than the external power supply voltage(s). In order to generate these relatively high voltage(s), the nonvolatile memory device may include a charge pump that operates to "pump" the level of a power supply voltage to that of the desired high voltage.

However, operation of the charge pump may become a primary contributor to the overall power consumption of the nonvolatile memory device. Further, incorporation of the charge pump may increases the size of the nonvolatile memory device. Additional circuitry is conventionally required to control the generation of the high voltage using the charge pump may. Such additional circuitry also increases the overall power consumption and size of the nonvolatile memory device. Also, ripple in the resulting high voltage provided by the operation of the charge pump may adversely impact the reliability of the nonvolatile memory device.

SUMMARY

Embodiments of the inventive concept provide nonvolatile memory devices exhibiting improved reliability, reduced power consumption and reduced size. Embodiments of the inventive concept also provide operating methods associated with such nonvolatile memory devices.

According to one embodiment, a nonvolatile memory device includes; a memory cell array including memory cells connected with bit lines and feedback cells connected with feedback bit lines, a row decoder connected with the memory cells and the feedback cells through word lines, a column decoder connected with the memory cells through the bit lines and connected with the feedback cells through the feedback bit lines, and a charge pump that generates a pump voltage provided to a selected word line among the word lines, wherein the charge pump is controlled in response to feedback currents flowing through the feedback bit lines.

According to another embodiment, a nonvolatile memory device includes; a memory cell array including memory cells connected with bit lines, a row decoder connected with the memory cells through word lines, a column decoder connected with the memory cells through the bit lines, a charge pump configured to generate a pump voltage provided to a selected word line among the word lines, a timing signal generator configured to generate timing signals having different transition timings in response to a clock signal, an internal signal generator configured to generate first control signals controlling the row decoder and second control signals controlling the column decoder in response to the timing signals, and an internal clock generator configured to generate an internal clock signal in response to the timing signals and to provide the internal clock signal to the charge pump during a write operation.

According to another embodiment, an operating method of a nonvolatile memory device includes; receiving a write command, generating an internal clock signal from an external clock signal in response to the write command, activating a charge pump in response to the internal clock signal to generate a pump voltage, applying the pump voltage to a word line selected from word lines connected with memory cells and feedback cells of the nonvolatile memory device, and monitoring feedback currents from feedback bit lines connected with the feedback cells to control the charge pump.

BRIEF DESCRIPTION OF THE DRAWINGS

The above and other objects and/or features of the inventive concept will become apparent to those skilled in the art upon consideration of the following description with reference to the accompanying drawings, in which.

FIGS. 6, 7 and 8 are respective circuit diagrams illustrating in one example the charge pump 154 of FIG. 1, wherein FIG. 7 illustrates the operation of the charge pump 154 of FIG. 6 when the internal clock signal iCK is low, and FIG. 8 illustrates the operation of the charge pump 154 of FIG. 6 when the internal clock signal iCK is high.

DETAILED DESCRIPTION

Embodiments of the inventive concept will now be described in some additional detail with reference to the accompanying drawings.

Figure 1:
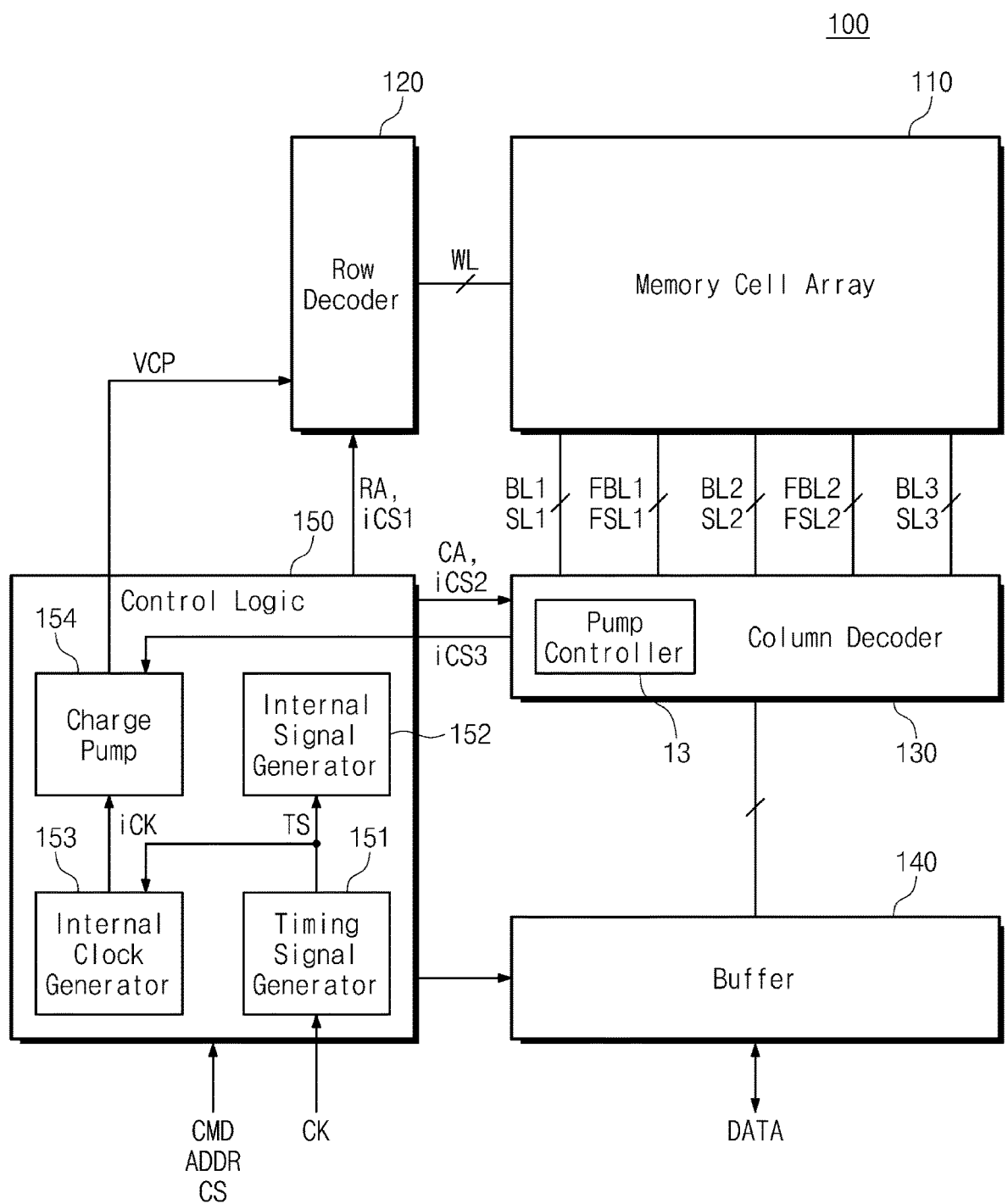
FIG. 1 is a block diagram illustrating a nonvolatile memory device according to embodiments of the inventive concept.

Figure (FIG. 1 is a block diagram illustrating a nonvolatile memory device 100 according to embodiments of the inventive concept. Referring to FIG. 1, the nonvolatile memory device 100 may include a memory cell array 110, a row decoder 120, a column decoder 130, a buffer 140, and control logic 150.

The memory cell array 110 may include memory cells. The memory cells may be nonvolatile memory cells, and may be variously configured to store single-bit or multi-bit data. The nonvolatile memory cells may variously include magnetic memory cells, ferroelectric memory cells, phase change memory cells, and/or resistive memory cells, for example.

In addition to the nonvolatile memory cells used to store data, the memory cell array 110 may also include feedback cells. The feedback cells may be generally similar to the memory cells, but may include certain structural differences.

The memory cells and the feedback cells may be manufactured using the same fabrication process(es).

The row decoder 120 may be connected with the memory cell array 110 through word lines WL, where the word lines WL may be connected with the memory cells and the feedback cells of the memory cell array 110. The row decoder 120 may receive a row address RA, first internal control signals iCS1, and a pump voltage VCP from the control logic 150.

The row decoder 120 may select one of the word lines WL in response to (or based on) the row address RA. The row decoder 120 may apply the pump voltage VCP to the selected word line in response to the first internal control signals iCS1. Here, the pump voltage VCP may be a high voltage having a level higher than that of a power supply voltage. For example, the pump voltage VCP may range from between about 2.0 V to 2.5 V.

The power supply voltage may be an externally generated voltage that is supplied to the nonvolatile memory device 100 and variously used to drive the operation of components within the nonvolatile memory device 100. For example, the power supply voltage may range from about 1.8 V to less than 1.8 V. In this regard, those skilled in the art will recognize that the nonvolatile memory device 100 may operate in response to the power supply voltage and a ground voltage.

The column decoder 130 may be connected with the memory cells of the memory cell array 110 through first bit lines BL1, second bit lines BL2, third bit lines BL3, first source lines SL1, second source lines SL2, and third source lines SL3. Here, the column decoder 130 may also be connected with the feedback cells of the memory cell array 110 through a first feedback bit line FBL1, a second feedback bit line FBL2, a first feedback source line FSL1, and a second feedback source line FSL2.

As illustrated in FIG. 1, the first and second feedback bit lines FBL1 and FBL2 may be distributed and disposed between the first, second, and third bit lines BL1, BL2, and BL3. The first feedback bit line FBL1 may be disposed between the first bit lines BL1 and the second bit lines BL2.

The second feedback bit line FBL2 may be disposed between the second bit lines BL2 and the third bit lines BL3.

The corresponding feedback source line FSL1 or FSL2 may be disposed at the feedback bit line FBL1 or FBL2, and the corresponding feedback cells may be connected therewith. The first bit lines BL1 and the third bit lines BL3 may be disposed on left and right edges of the memory cell array 110. Alternately, a feedback bit line may be disposed on the left or right edge of the memory cell array 110. A feedback bit line may be disposed between bit lines. Alternately, two or more feedback bit lines may be disposed adjacent to each other between bit lines.

The column decoder 130 may be connected with the buffer 140. During a write operation, the column decoder 130 may receive data from the buffer 140 under the control of the control logic 150. During a read operation, the column decoder 130 may output data to the buffer 140 under the control of the control logic 150.

The column decoder 130 may receive a column address CA and second internal control signals iCS2 from the control logic 150. In response to the column address CA, the column decoder 130 may select at least one bit line from among the first to third bit lines BL1 to BL3, and at least one source line corresponding to the at least one bit line from among the first to third source lines SL1 to SL3.

In response to the second internal control signals iCS2, the column decoder 130 may apply various voltages to the selected at least one bit line and the selected at least one source line. For example, during the write operation, the column decoder 130 may apply voltages to the selected at least one bit line and the selected at least one source line in response to data received from the buffer 140.

During the read operation, the column decoder 130 may apply read voltages to the selected at least one bit line and the selected at least one source line. Also, in the read operation, the column decoder 130 may sense a voltage or a current of the selected at least one bit line or the selected at least one source line in response to the second internal control signals iCS2. The column decoder 130 may output the sensing result to the buffer 140.

In the illustrated example of FIG. 1, the column decoder 130 includes a pump controller 13. During the write operation, the pump controller 13 may apply voltages to the first and second feedback source lines FSL1 and FSL2, or the first and second feedback bit lines FBL1 and FBL2. Further, during the write operation, the pump controller 13 may receive feedback currents from the first and second feedback bit lines FBL1 and FBL2, or the first and second feedback source lines FSL1 and FSL2.

The pump controller 13 may generate a third internal control signal iCS3 in response to the feedback currents. The third internal control signal iCS3 may be transferred to the control logic 150 and may be used to control a charge pump 154.

Under the control of the control logic 150 and during the write operation, the buffer 140 may receive data from the external device, and may transfer the data received from the external device to the column decoder 130. Under the control of the control logic 150 and during the read operation, the buffer 140 may receive data from the column decoder 130 and may transfer the data received from the column decoder 130 to the external device.

The control logic 150 may control various operations of the nonvolatile memory device 100, such as the write operation and the read operation. In this regard, the control logic 150 may receive a command CMD, an address ADDR, and a control signal CS from an external device. The control logic 150 may transfer the row address RA of the received address ADDR to the row decoder 120. The control logic 150 may transfer the column address CA of the received address ADDR to the column decoder 130.

The control logic 150 may control components of the nonvolatile memory device 100 in response to the command CMD and the control signal CS in order to perform various operations, such as the read operation and the write operation. The control logic 150 may include a timing signal generator 151, an internal signal generator 152, an internal clock generator 153, and the charge pump 154.

The timing signal generator 151 may receive a clock signal CK from the external device. The clock signal CK may toggle between a high level (e.g., a level of the power supply voltage) and a low level (e.g., a ground voltage level). The timing signal generator 151 may generate various timing signals TS from the clock signal CK. For example, the timing signal generator 151 may variously delay the clock signal CK to generate a plurality of timing signals TS.

The internal signal generator 152 may receive the timing signals TS from the timing signal generator 151. The internal signal generator 152 may generate the first internal control signals iCS1 and the second internal control signals iCS2 in response to the timing signals TS. For example, the internal signal generator 152 may generate the corresponding internal control signal of the first internal control signals iCS1 and the second internal control signals iCS2 in response to one of the timing signals TS.

The internal clock generator 153 may receive the timing signals TS from the timing signal generator 151. The internal clock generator 153 may generate an internal clock signal iCK from the timing signals TS. Here, the frequency of the internal clock signal iCK may be higher than the frequency of the clock signal CK. Hence, a period of the internal clock signal iCK may be less than a period of the clock signal CK.

The internal clock generator 153 may output the toggling internal clock signal iCK (hereafter, the "activated internal clock signal iCK") during certain first-type operation(s) (e.g., the write operation) of the nonvolatile memory device 100, and output a fixed-level internal clock signal iCK (hereafter, the "deactivated internal clock signal iCK") during second-type operation(s), other than the first-type operation(s), of the nonvolatile memory device 100. In this regard, the internal clock generator 153 may activate/deactivate the internal clock signal iCK in units of one period (or cycle) of the clock signal CK.

The charge pump 154 may receive the internal clock signal iCK from the internal clock generator 153, and may receive the third internal control signal iCS3 from the pump controller 13. The charge pump 154 may generate the pump voltage VCP in response to the internal clock signal iCK and the third internal control signal iCS3.

In the illustrated example of FIG. 1, the pump controller 13 is shown as being included within the column decoder 130. However, this need not always be the case and the pump controller 13 may be otherwise disposed within the nonvolatile memory device 100.

Figure 2:
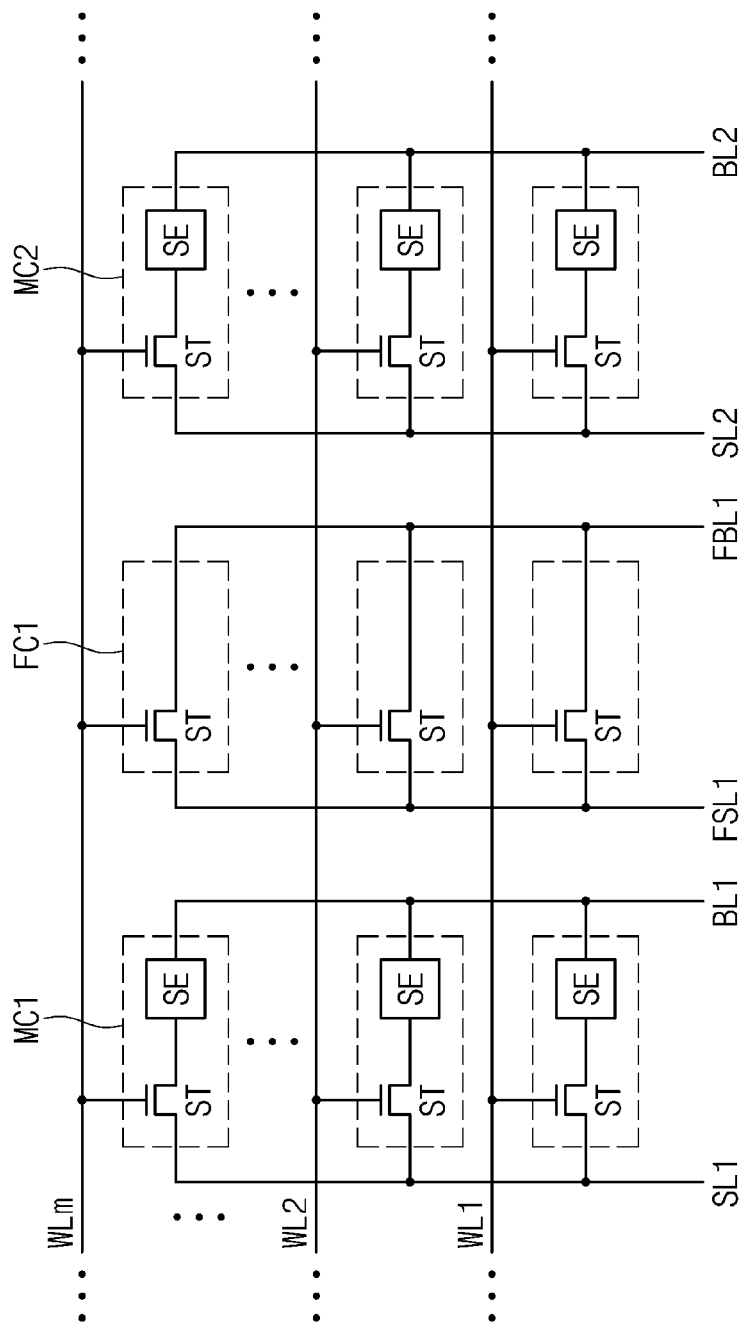
FIG. 2 is a partial circuit diagram further illustrating in one example the memory cell array 110 of FIG. 1.

FIG. 2 is a partial circuit diagram further illustrating in one example the memory cell array 110 of FIG. 1. Referring to FIGS. 1 and 2, first memory cells MC1 may be connected with one first bit line BL1, one first source line SL1, and first to m-th word lines WL1 to WLm (m being a positive integer). The first to m-th word lines WL1 to WLm may be included in the word lines WL of FIG. 1.

Each of the first memory cells MC1 may include a selection transistor ST and a storage element SE. The selection transistor ST and the storage element SE may be connected between the first source line SL1 and the first bit line BL1. A gate of the selection transistor ST may be connected with the corresponding word line of the first to m-th word lines WL1 to WLm.

Second memory cells MC2 may be connected with one second bit line BL2, one second source line SL2, and the first to m-th word lines WL1 to WLm. A structure of the second memory cells MC2 may be similar to the structure of the first memory cells MC1.

First feedback cells FC1 may be connected with the first feedback source line FSL1, the first feedback bit line FBL1, and the first to m-th word lines WL1 to WLm between the first bit line BL1 and the second source line SL2. Each of the feedback cells FC1 may include the selection transistor ST. Compared to the first and second memory cells MC1 and MC2, the first feedback cells FC1 may have a structure in which the storage element SE is short-circuited.

In the first and second memory cells MC1 and MC2, the storage element SE is illustrated as being connected with the selection transistor ST, but the inventive concept is not limited thereto. The storage element SE may be connected with a selection element including various elements capable of performing a switching function, such as a transistor and a diode.

Figure 3:
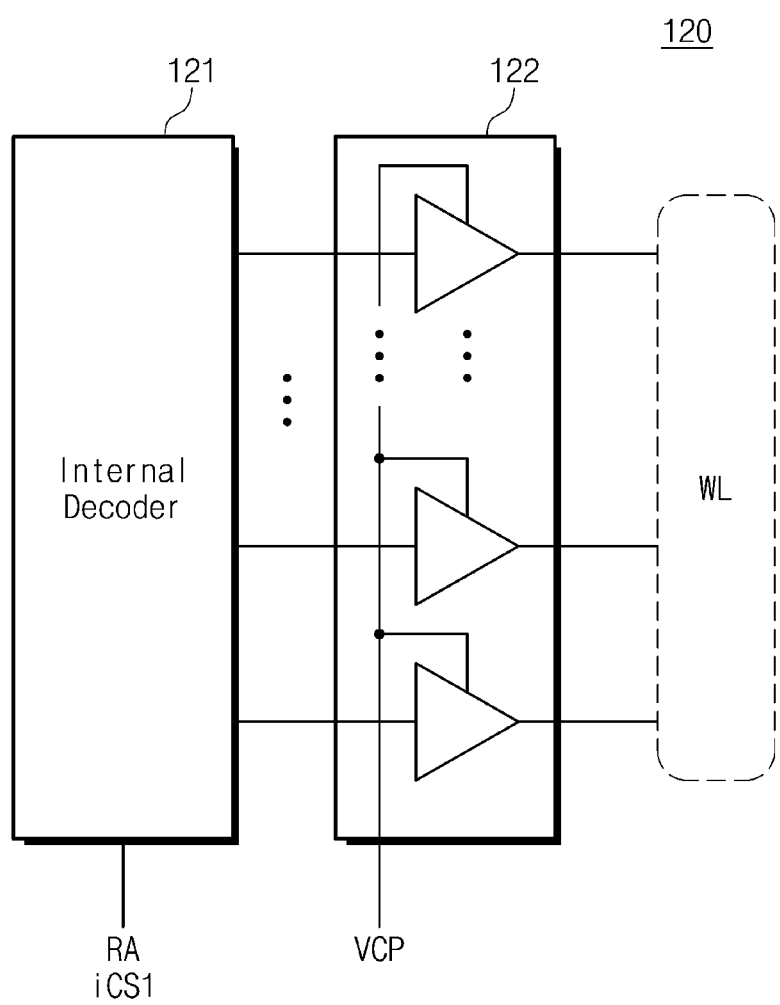
FIG. 3 is a block diagram further illustrating in one example the row decoder 120 of FIG. 1.

FIG. 3 is a block diagram further illustrating in one example the row decoder 120 of FIG. 1. Referring to FIGS. 1 and 3, the row decoder 120 may include an internal decoder 121 and word line drivers 122. The internal decoder 121 may receive the row address RA and the first internal control signals iCS1 from the control logic 150.

The internal decoder 121 may select one of the word line drivers 122 in response to the row address RA. The internal decoder 121 may control the word line drivers 122 in response to the first internal control signals iCS1, such that a word line driver selected from the word line drivers 122 outputs a voltage having a first level (hereafter, the "first voltage"), whereas each of the unselected word line drivers outputs a voltage having a second level different from the first level (hereafter, the "second voltage").

The word line drivers 122 may selectively apply the first voltage or the second voltage to the word lines WL under the control of the internal decoder 121. The word line drivers 122 may receive the pump voltage VCP from the charge pump 154 in addition to receiving the power supply voltage and the ground voltage.

When various voltages are applied to the word lines WL during first-type operations of the nonvolatile memory device 100, the word line drivers 122 may output the pump voltage VCP as the first voltage and may output the ground voltage as the second voltage. In contrast, when various voltages are applied to the word lines WL during second-type operations of the nonvolatile memory device 100, the word line drivers 122 may output the power supply voltage as the first voltage and may output the ground voltage as the second voltage.

Referring to FIGS. 1, 2, and 3, voltages of the word lines WL1 to WLm are applied to gates of the selection transistors ST. The amount of current flowing (or capable of flowing) through the selection transistor ST may be adjusted by a voltage of the corresponding word line. Thus, compared with certain second-type operations (e.g., the read operation), a first-type operation (e.g., the write operation) may result in a greater current flowing through the selection transistor ST between a source line (e.g., SL1) and a bit line (e.g., BL1). Accordingly, in order to increase the current flowing through the selection transistor ST under the control of the control logic 150, the word line drivers 122 may output the pump voltage VCP having a level that is greater than the level of the power supply voltage as the first voltage.

Figure 4:
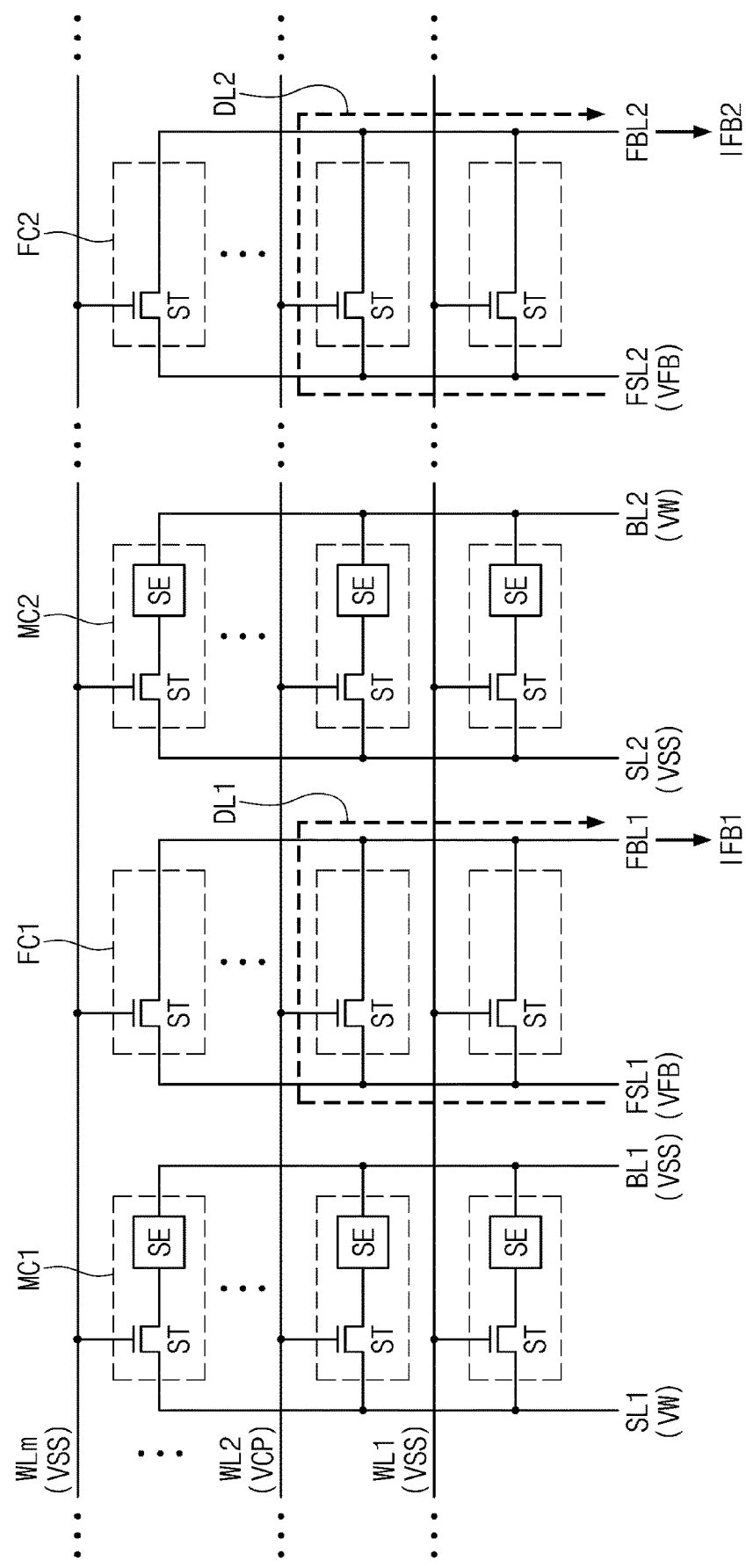
FIG. 4 is a partial circuit diagram further illustrating in one example the application of certain voltages to the memory cell array 110 of FIG. 1 during a write operation.

FIG. 4 is a partial circuit diagram illustrating in one example the selective application of voltages to the memory cell array 110 of FIG. 1 during a write operation. Comparing the illustrated example of FIG. 2, second feedback cells FC2 connected with the second feedback source line FSL2, the second feedback bit line FBL2, and the first to m-th word lines WL1 to WLm are shown.

Referring to FIGS. 1, 2 and 4, the first voltage (e.g., the pump voltage VCP) is applied to the second word line WL2, and the second voltage (e.g., the ground voltage VSS) is respectively applied to the remaining word lines, other than the second word line WL2, of the first to m-th word lines WL1 to WLm. In this manner, the second word line WL2 may be selected by the write operation.

A write voltage VW may be applied to the first source line SL1, and the ground voltage VSS may be applied to the first bit line BL1. Here, the write voltage VW may be equal to or greater than a power supply voltage VDD. A value of "1" may be written in the first memory cell MC1 connected with the second word line WL2 from among the first memory cells MC1 by the these voltages being respectively applied to the second word line WL2, the first source line SL1, and the first bit line BL1.

Alternately, the ground voltage VSS may be applied to the second source line SL2, and the write voltage VW may be applied to the second bit line BL2, and a value of "0" may be written in the second memory cell MC2 connected with the second word line WL2 from among the second memory cells MC2 by these voltages being respectively applied to the second word line WL2, the second source line SL2, and the second bit line BL2.

During the write operation, a feedback voltage VFB may be applied to the first feedback source line FSL1 and the second feedback source line FSL2, regardless of the data being written to the first memory cell MC1 and the second memory cell MC2. The feedback voltage VFB may be the power supply voltage, the write voltage VW, or any other voltage having a level similar to those of the power supply voltage and the write voltage VW.

Due to the pump voltage VCP applied to the second word line WL2 and the feedback voltage VFB applied to the first feedback source line FSL1, a first feedback current IFB1 may flow through the first feedback bit line FBL1, as shown in FIG. 4 by a first dotted line DL1. Here, the amount of first feedback current IFB1 may be influenced by the level of the pump voltage VCP. In contrast, due to the pump voltage VCP applied to the second word line WL2 and the feedback voltage VFB applied to the second feedback source line FSL2, a second feedback current IFB2 may flow through the second feedback bit line FBL2, as shown in FIG. 4 by a second dotted line DL2. Here, the amount of second feedback current IFB2 may be influenced by the level of the pump voltage VCP.

As illustrated in FIG. 4, during first-type operations (e.g., the write operation), when the pump voltage VCP is applied to a selected word line as the first voltage, the feedback voltage VFB may be applied to the feedback source lines FSL1 and FSL2. That is, the feedback currents IFB1 and IFB2 may flow through the feedback source lines FSL1 and FSL2. In contrast, during second-type operations (e.g., the read operation), the feedback voltage VFB is not applied to the feedback source lines FSL1 and FSL2, and the feedback currents IFB1 and IFB2 do not flow through the feedback source lines FSL1 and FSL2.

Here, the first feedback current IFB1 and the second feedback current IFB2 are generated by the feedback cells FC1 and FC2 at different locations (or positions) within the memory cell array 110. Accordingly, due to process variations in the fabrication of the respective feedback cells FC1 and FC2, the amount of first feedback current IFB1 and the amount of second feedback current IFB2 may be different.

Figure 5:
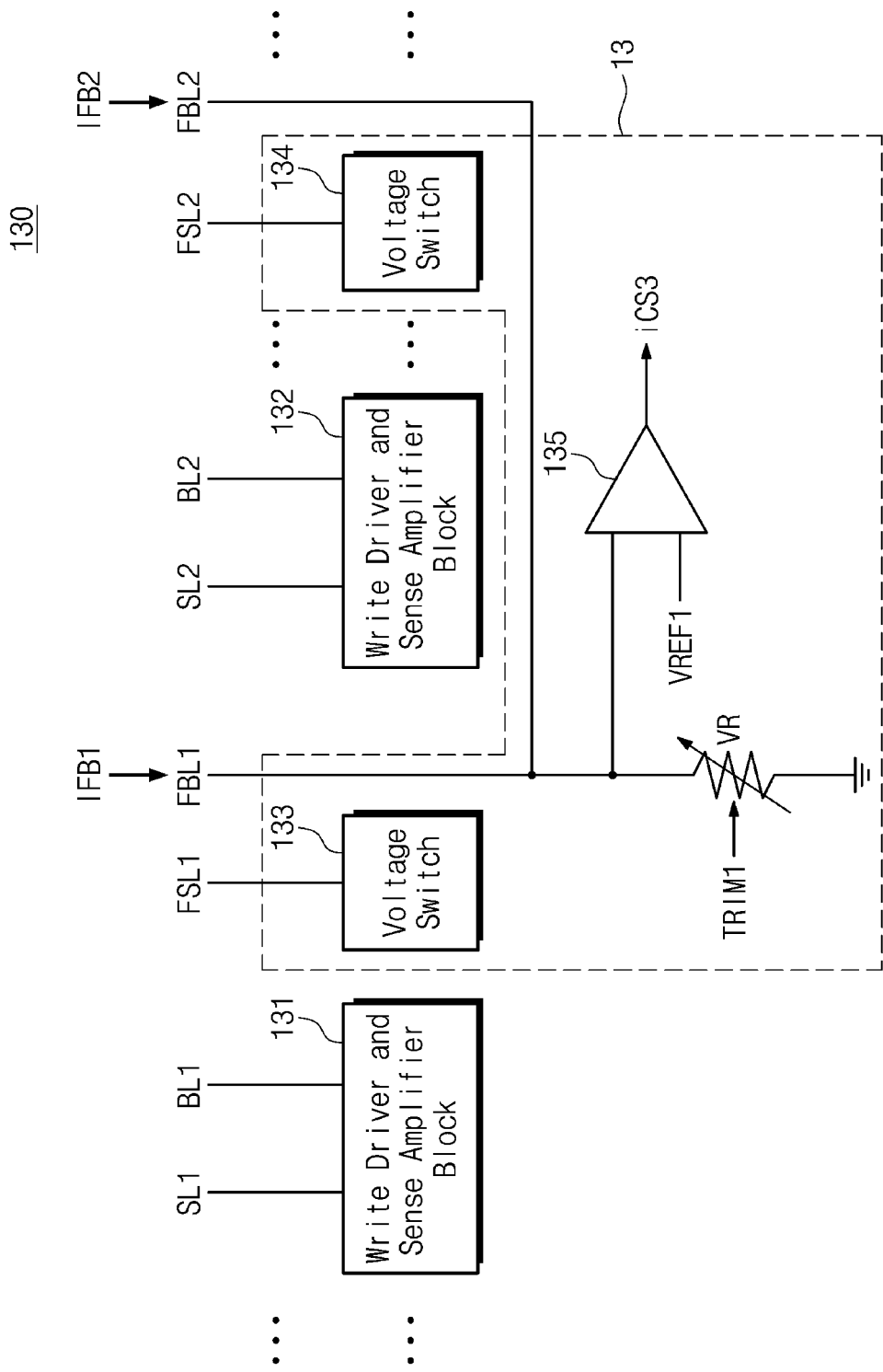
FIG. 5 is a block diagram further illustrating in one example the column decoder 130 of FIG. 1.

FIG. 5 is a block diagram further illustrating in one example the column decoder 130 of FIG. 1. Here, certain components corresponding to components of the memory cell array 110 shown in FIG. 4 from among components of the column decoder 130 are illustrated in FIG. 5.

Referring to FIGS. 1, 4, and 5, the column decoder 130 may include a write driver and sense amplifier block 131 connected with the first source line SL1 and the first bit line BL1. When data are written in the corresponding memory cell, the write driver and sense amplifier block 131 may apply the write voltage VW to one of the first source line SL1 and the first bit line BL1 and may apply the ground voltage VSS to the other thereof. In contrast, when data is read from the corresponding memory cell, the write driver and sense amplifier block 131 may apply the read voltage to one of the first source line SL1 and the first bit line BL1 and may sense the amount of current flowing through the other thereof or a related voltage.

The column decoder 130 may further include a write driver and sense amplifier block 132 connected with the second source line SL2 and the second bit line BL2. The write driver and sense amplifier blocks 131 and 132 may have the same structure and may operate in the same scheme.

The column decoder 130 may further include a voltage switch 133 connected with the first feedback source line FSL1. When the pump voltage VCP is applied to a selected word line as the voltage of the first level, the voltage switch 133 may apply the feedback voltage VFB to the first feedback source line FSL1.

The column decoder 130 may further include a voltage switch 134 connected with the second feedback source line FSL2. The voltage switches 133 and 134 may have the same structure and may operate in the same scheme.

The column decoder 130 may further include a comparator 135 and a variable resistor VR. The variable resistor VR may be a load receiving the first feedback current IFB1 and the second feedback current IFB2. Because the first feedback current IFB1 and the second feedback current IFB2 are transferred to a common load, a difference between the amount of first feedback current IFB1 and the amount of second feedback current IFB2 due to process variation(s) may be averaged and compensated for.

In certain embodiments, a resistance value of the variable resistor VR may be determined using a first trim signal TRIM1. Here, the first trim signal TRIM1 may be received (e.g.,) from the control logic 150. The first trim signal TRIM1 may be used to adjust the resistance value of the variable resistor VR based on a resistance value of a memory cell MC1 or MC2.

For example, the first trim signal TRIM1 may control the variable resistor VR, such that a resistance value corresponding to a value obtained by dividing the resistance value of the memory cell MC1 and MC2 by the number of feedback currents IFB1 and IFB2 input to the variable resistor VR. That is, the resistance value of the variable resistor VR may be determined by the following equation:

$$R + \frac{R_{MC}}{q},$$

where "R" is the resistance value of the variable resistor VR, "q" is the number (i.e., a positive integer) of feedback bit lines FBL1 and FBL2 connected to the variable resistor VR, and "$R_{MC}$" is a least resistance value or a greatest resistance value of the memory cell MC1 or MC2. Here, feedback cells through which the feedback currents IFB1 and IFB2 flow may form a voltage divider having a defined ratio (e.g., 1:1) together with the variable resistor VR.

The comparator 135 may compare a voltage of the variable resistor VR with a first reference voltage VREF1. When the voltage of the variable resistor VR is less than the first reference voltage VREF1, the comparator 135 may output a high level (or a low level), and when the voltage of the variable resistor VR is equal to or greater than the first reference voltage VREF1, the comparator 135 may output the low level (or the high level). In this regard, the output of the comparator 135 may be the third internal control signal iCS3.

A level of the first reference voltage VREF1 may be determined in response to a target level of the pump voltage VCP and the voltage division ratio defined by the feedback cells and the variable resistor VR. For example, when a voltage of the variable resistor VR is j % ('j' being a positive number) of the target level of the pump voltage VCP, the first reference voltage VREF1 may be set to j % of the target level of the pump voltage VCP.

In certain embodiments, the voltage switches 133 and 134, the variable resistor VR, and the comparator 135 may constitute the pump controller 13.

Specific source lines and specific bit lines are described in the foregoing embodiments. However, the structure, operation and characteristics described in relation to the specific source lines and bit lines may be similarly applied to the other source lines and bit lines. Likewise, examples of specific feedback source lines and feedback bit lines are described in the foregoing embodiments. However, the structure, operation and characteristics described in relation to the specific feedback source lines and feedback bit lines may be similarly applied to the other feedback source lines and feedback bit lines.

Figure 6:
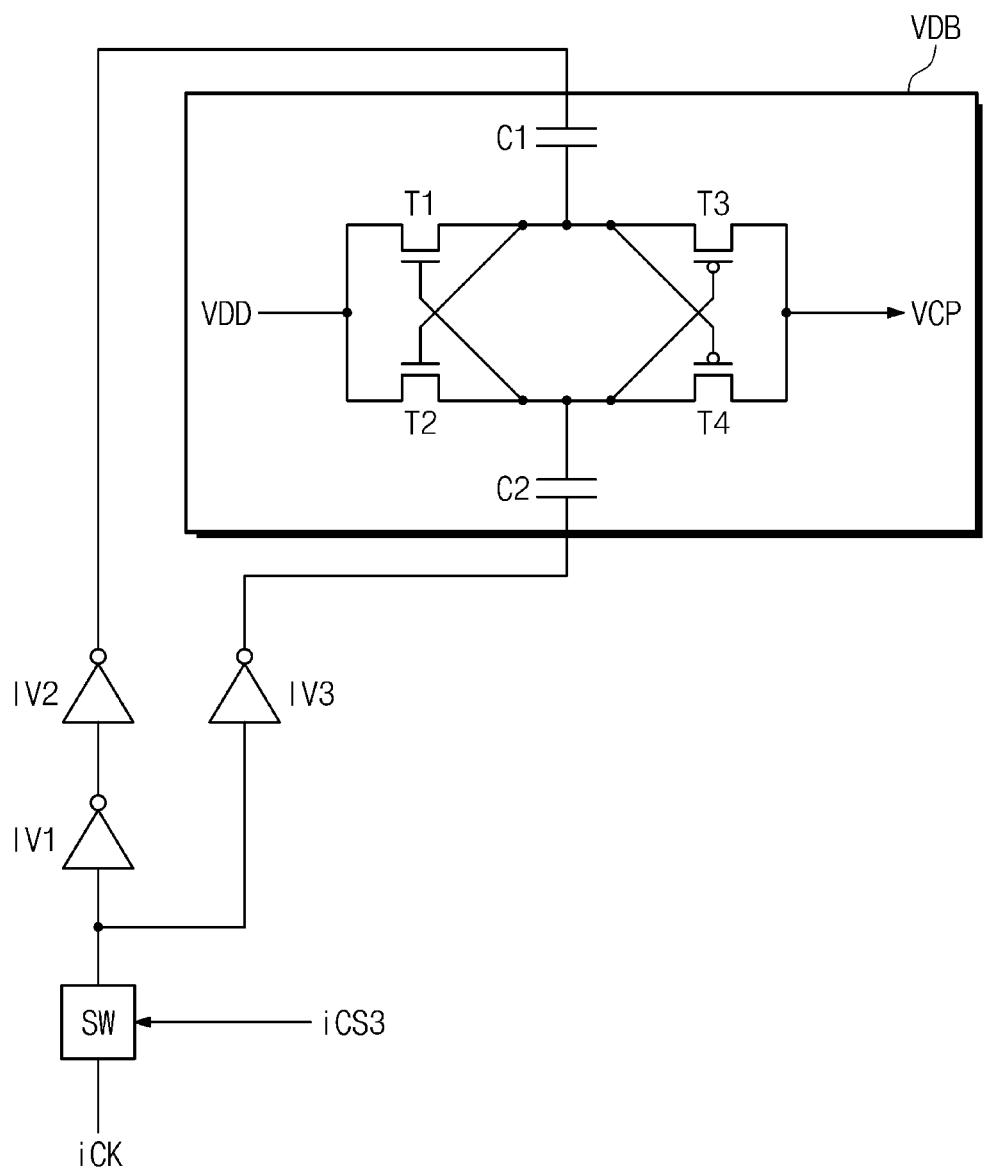
Figure 7:
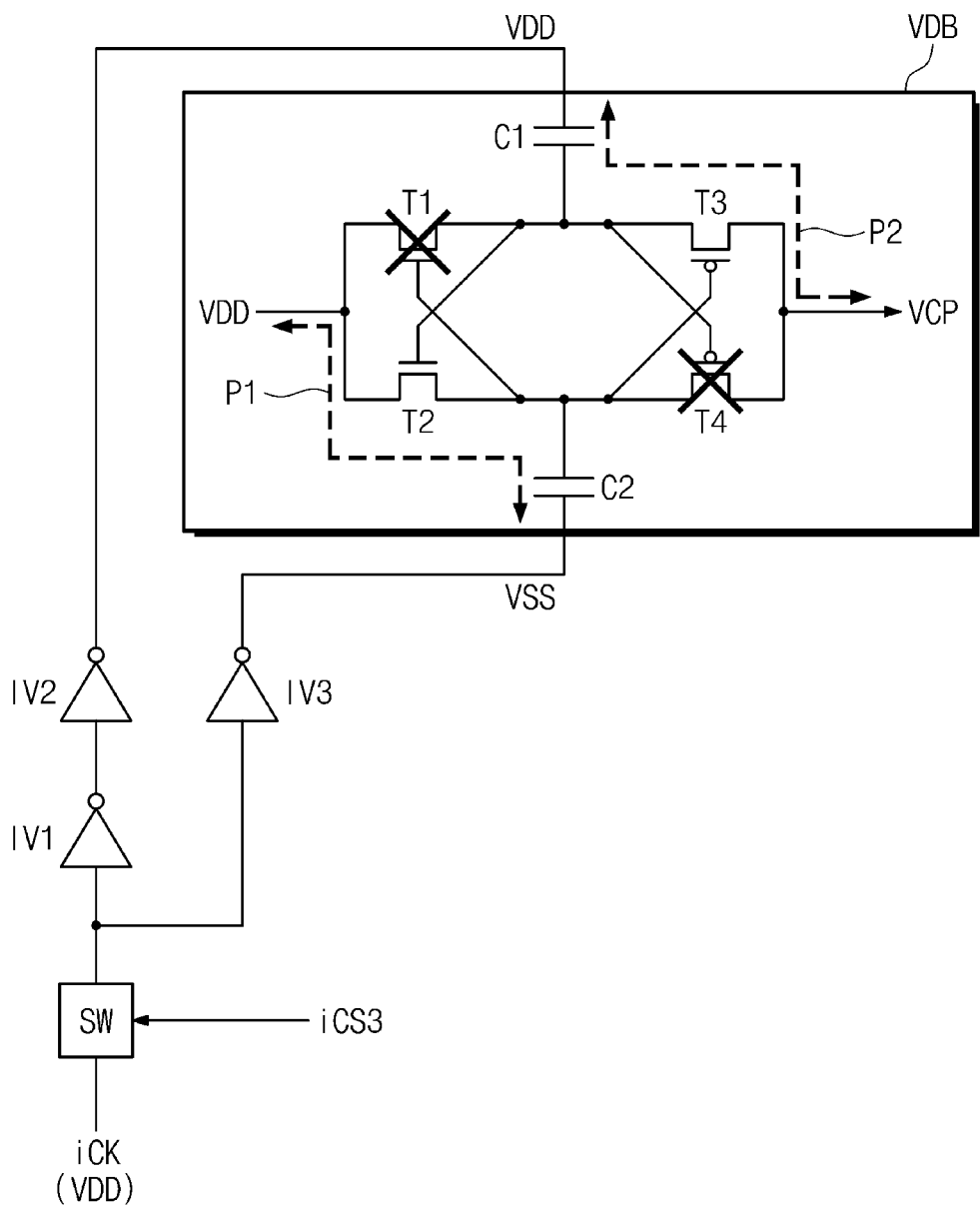
Figure 8:
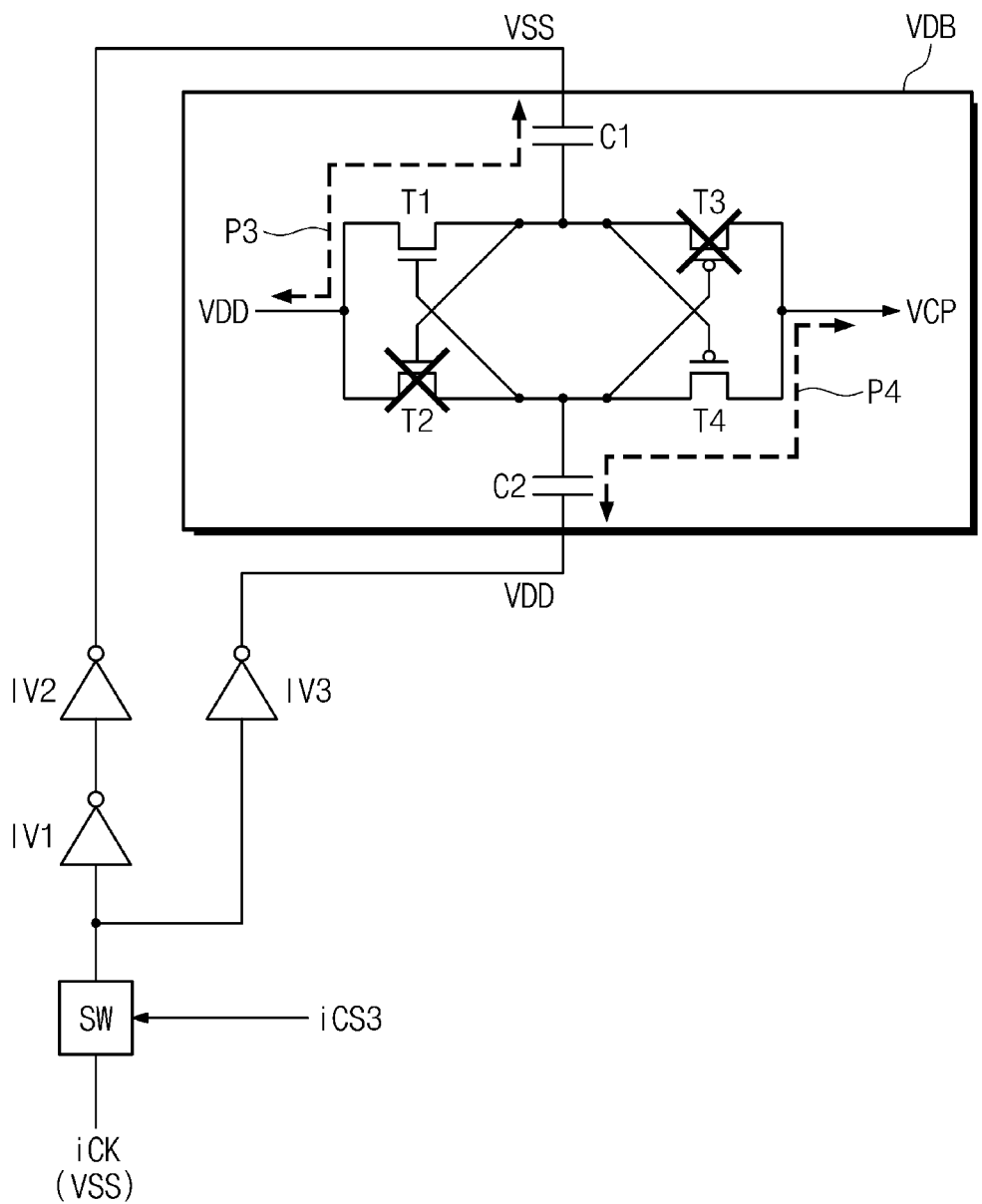

FIGS. 6, 7 and 8 are respective circuit diagrams illustrating in one example the charge pump 154 of FIG. 1, wherein FIG. 7 illustrates the operation of the charge pump 154 of FIG. 6 when the internal clock signal iCK is low, and FIG. 8 illustrates the operation of the charge pump 154 of FIG. 6 when the internal clock signal iCK is high.

Referring to FIGS. 1, 5, and 6, the charge pump 154 may include a switch SW, a first inverter IV1, a second inverter IV2, a third inverter IV3, and a voltage doubler VDB.

The switch SW may receive the internal clock signal iCK from the internal clock generator 153 and the third internal control signal iCS3 from the pump controller 13. In certain embodiments of the inventive concept, when the third internal control signal iCS3 is high, the switch SW may pass the internal clock signal iCK, and when the third internal control signal iCS3 is low, the switch SW may block the internal clock signal iCK. (Here, those skilled in the art will recognize that the identification of certain signal levels as being "low" or "high" is arbitrary and may be reversed in other embodiments).

The first inverter IV1 may receive the internal clock signal iCK from the switch SW and may invert and output the internal clock signal iCK. The second inverter IV2 may receive an output of the first inverter IV1 and may invert and output the output of the first inverter IV1. An output of the second inverter IV2 may be the internal clock signal iCK.

The third inverter IV3 may receive the internal clock signal iCK from the switch SW and may invert and output the internal clock signal iCK. An output of the third inverter IV3 may be an inverted version of the internal clock signal iCK, that is, an inverted internal clock signal (e.g.,/iCK).

The voltage doubler VDB may receive the internal clock signal iCK from the second inverter IV2 and may receive the inverted internal clock signal/iCK from the third inverter IV3. The voltage doubler VDB may receive the power supply voltage VDD and may output the pump voltage VCP. The voltage doubler VDB may boost a level of the pump voltage VCP from a level of the power supply voltage VDD to two times the level of the power supply voltage VDD.

In certain embodiments of the inventive concept like the one illustrated in FIG. 6, the voltage doubler VDB may include a first capacitor C1, a second capacitor C2, a first transistor T1, a second transistor T2, a third transistor T3, and a fourth transistor T4.

The first capacitor C1 may be connected between the output of the second inverter IV2 and gates of the second and fourth transistors T2 and T4. The second capacitor C2 may be connected between the output of the third inverter IV3 and gates of the first and third transistors T1 and T3. For example, the capacitance of each of the first and second capacitors C1 and C2 may be about 0.5 pF.

The first transistor T1 and the third transistor T3 may be connected between a power node to which the power supply voltage VDD is supplied and an output node from which the pump voltage VCP is output. The second transistor T2 and the fourth transistor T4 may be connected between the power node and the output node.

Referring to FIG. 7, when the internal clock signal iCK is high, the power supply voltage VDD may be transferred to the first capacitor C1. Also, the ground voltage VSS may be transferred to the second capacitor C2.

The second transistor T2 may be turned ON in response to the power supply voltage VDD, and the fourth transistor T4 may be turned OFF in response to the power supply voltage VDD. The first transistor T1 may be turned OFF in response to the ground voltage VSS, and the third transistor T3 may be turned ON in response to the ground voltage VSS.

As the second transistor T2 is turned ON, through a first path P1, the power supply voltage VDD may be charged in the second capacitor C2. As the third transistor T3 is turned ON, through a second path P2, a voltage being a sum of the power supply voltage VDD and the charged voltage in the first capacitor C1 may be output as the pump voltage VCP.

Referring to FIG. 8, when the internal clock signal iCK is low, the ground voltage VSS may be transferred to the first capacitor C1. Also, the power supply voltage VDD may be transferred to the second capacitor C2.

The second transistor T2 may be turned OFF in response to the ground voltage VSS, and the fourth transistor T4 may be turned ON in response to the ground voltage VSS. The first transistor T1 may be turned ON in response to the power supply voltage VDD, and the third transistor T3 may be turned OFF in response to the power supply voltage VDD.

As the first transistor T1 is turned ON, through a third path P3, the power supply voltage VDD may be charged in the first capacitor C1. As the fourth transistor T4 is turned ON, through a fourth path P4, a voltage being a sum of the power supply voltage VDD and the charged voltage in the second capacitor C2 may be output as the pump voltage VCP.

As described with reference to FIGS. 7 and 8, as the internal clock signal iCK toggles between high and low, one of the first and second capacitors C1 and C2 is charged, and the other thereof is used to boost the pump voltage VCP. Accordingly, while the internal clock signal iCK toggles between high and low, the level of the pump voltage VCP may gradually increase from the level of the power supply voltage VDD.

Referring again to FIGS. 1, 5, and 6, the third internal control signal iCS3 may control the activation (e.g., the boosting of the pump voltage VCP) and deactivation (e.g., the stopping of the boosting of the pump voltage VCP) of the charge pump 154. (Hereafter, the term "activation/deactivation" will be used to denote change(s) in the operation (e.g., the boosting operation) of the charge pump in relation to one or more voltage(s)).

When the level of the pump voltage VCP is less than the target level, the charge pump 154 may be activated. When the level of the pump voltage VCP is equal to or greater than the target level, the charge pump 154 may be deactivated.

In this regard, those skilled in the art will recognize that various approaches may be used to monitor the output voltage of a charge pump, and that the monitored output voltage may be variously used to control the activation/deactivation of the charge pump. For example, a voltage divider may be used to divide the output voltage of the charge pump to generate a monitoring voltage that ranges from a level of the power supply voltage to the ground voltage level. This monitoring voltage may then be compared with a generated voltage and a reference voltage to determine the activation/deactivation of the charge pump.

However, the accuracy of this approach is not good. For example, assuming that the output voltage of the charge pump has a ripple of about 100 mV, and further assuming the use of a 1:1 voltage divider, the voltage generated by the voltage divider may have a ripple of 50 mV. Hence, the activation/deactivation of the charge pump may errantly operate in response to a range of 50 mV, and such errant operation may be reflected to the output voltage of the charge pump.

In contrast, the charge pump 154 of the nonvolatile memory device 100 according to embodiments of the inventive concept may be controlled in response to the feedback currents IFB1 and IFB2 flowing through the feedback cells FC1 and FC2. The pump voltage VCP of the charge pump 154 is transferred to the feedback cells FC1 and FC2 through a selected word line. A capacitance (e.g., a self-parasitic capacitance as well as a parasitic capacitance with adjacent word line(s)) of the selected word line may dramatically reduce the ripple of the pump voltage VCP at the feedback cells FC1 and FC2.

Because the activation/deactivation of the charge pump 154 is controlled in response to the feedback currents IFB1 and IFB2, the influence of the ripple of the pump voltage VCP provided by the charge pump 154 may be reduced or completely eliminated. Accordingly, the reliability of the nonvolatile memory device 100 may be improved.

Thus outcome is notable, since many comparative designs increase the accuracy of a boosted power supply voltage with respect to a given target level by using a charge pump that includes two or more stages, wherein each stage includes two or more capacitors. Such comparative designs suffer accordingly from increased size.

As described above, the nonvolatile memory device 100 according to embodiments of the inventive concept may control the charge pump 154 with excellent accuracy by activating/deactivating the charge pump 154 in response to the feedback currents IFB1 and IFB2. Accordingly, as illustrated in FIG. 6, the charge pump 154 may be implemented by using the voltage doubler VDB including a single stage. As a result, the size of the nonvolatile memory device 100 may be reduced relative to the comparative examples.

The voltage doubler VDB may gradually increase the level of the pump voltage VCP from the level of the power supply voltage VDD to two times (2×) the level of the power supply voltage VDD. Two times (2×) the level of the power supply voltage VDD may be higher than the target level of the pump voltage VCP. When a level of the pump voltage VCP reaches the target level, the charge pump 154 may be deactivated by the third internal control signal iCS3.

Further, the structure of the charge pump 154 may be simplified by activating/deactivating the charge pump 154 according to appropriate timing with the high accuracy, and thus, the size of the nonvolatile memory device 100 may be reduced.

In certain comparative examples, the monitoring of an output voltage of the charge pump may require a high-capacity capacitor disposed at an output terminal of the charge pump for the purpose of suppressing ripple on the output voltage. In contrast, embodiments of the inventive concept like the nonvolatile memory device 100 of FIG. 1 effectively use the capacitance of a selected word line as a capacitor disposed at an output terminal of the charge pump 154. Hence, because it is unnecessary to add a high-capacity capacitor to the output terminal of the charge pump 154, the size of the nonvolatile memory device 100 may be further reduced.

Figure 9:
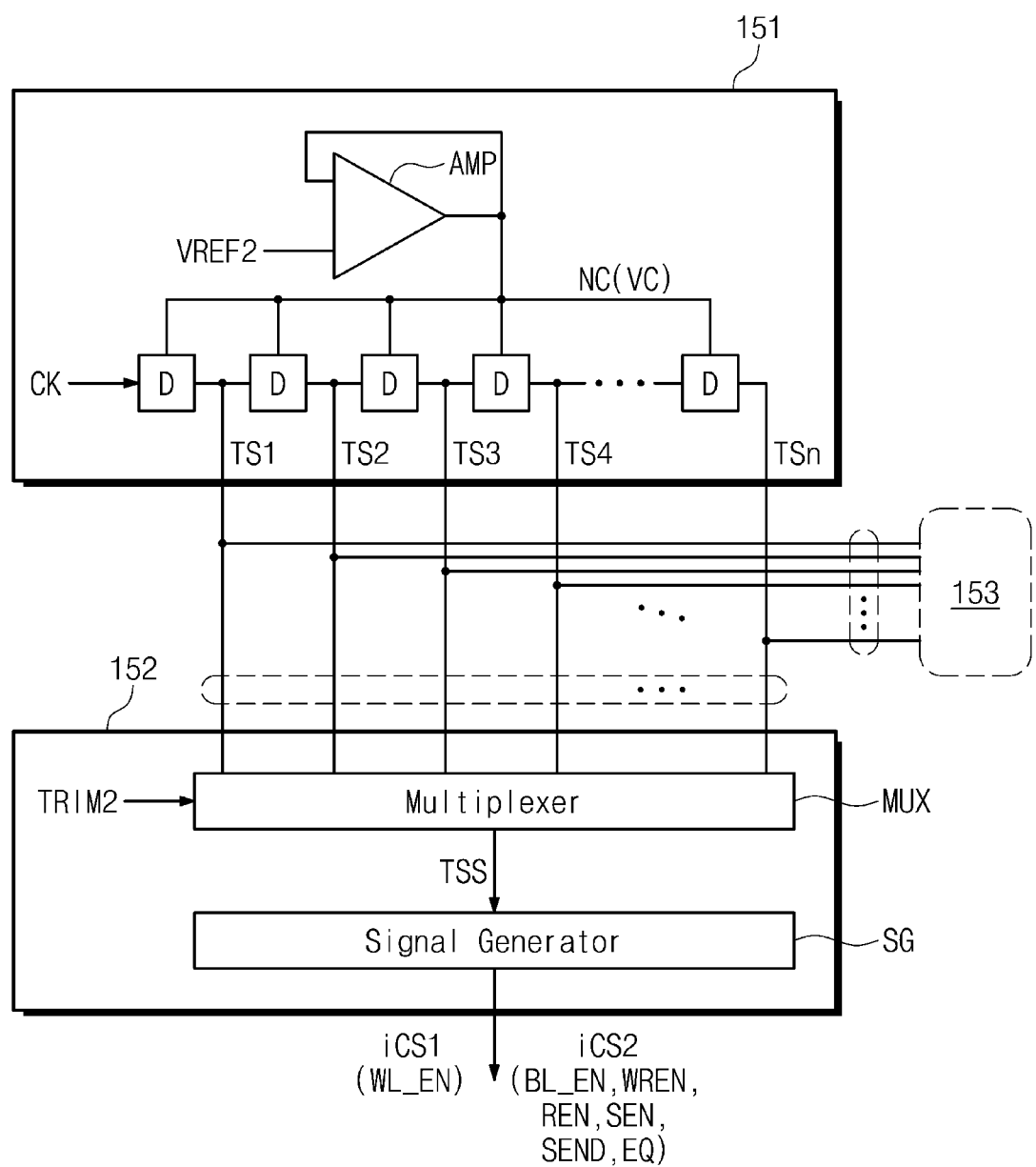
FIG. 9 is a block diagram further illustrating in one example the timing signal generator 151 of FIG. 1.

FIG. 9 is a block diagram further illustrating in one example the timing signal generator 151 and the internal signal generator 152 of FIG. 1. Referring to FIGS. 1 and 9, the timing signal generator 151 is assumed to include "D" delay units that may be used to sequentially delay the clock signal CK in order to generate first to n-th timing signals TS1 to TSn.

Assuming, for example, that the number of delay units "D" is 10, a delay amount of the delay units "D" may be $\frac{1}{20}$ of the period of the clock signal CK. In certain embodiments, the first to n-th timing signals TS1 to TSn may be included in the timing signals TS of FIG. 1.

The timing signal generator 151 may further include an amplifier AMP that receives a second reference voltage VREF2 and provides the second reference voltage VREF2 to the delay units "D". The amplifier AMP may receive a common voltage VC of a common node NC connected in common with the delay units "D".

The amplifier AMP may amplify a difference between the second reference voltage VREF2 and the common voltage VC and may output the amplified result to the common node NC. The amplifier AMP may control an output such that the common voltage VC is equal to the second reference voltage VREF2. For example, the second reference voltage VREF2 may have a level that is equal or similar to that of the power supply voltage.

The first to n-th timing signals TS1 to TSn output from the delay units "D" may be transferred to the internal signal generator 152 and the internal clock generator 153.

The internal signal generator 152 may include a multiplexer MUX and a signal generator SG. The multiplexer MUX may receive the first to n-th timing signals TS1 to TSn. The multiplexer MUX may receive a second trim signal TRIM2 as a selection signal. The multiplexer MUX may output timing signals TSS selected by the second trim signal TRIM2 from among the first to n-th timing signals TS1 to TSn to the signal generator SG.

The signal generator SG may receive the selected timing signals TSS from the multiplexer MUX. The signal generator SG may generate the first internal control signals iCS1 and the second internal control signals iCS2 in response to the selected timing signals TSS.

The first internal control signals iCS1 may include a word line enable signal WL_EN. In response to the word line enable signal WL_EN, the row decoder 120 may apply the voltage of the first level to a selected word line and may apply the voltages of the second level to unselected word lines.

The second internal control signals iCS2 may include a bit line enable signal BL_EN, a write enable signal WREN, a read enable signal REN, a sensing enable signal SEN, a sensing enable delay signal SEND, and an equalize signal EQ.

In response to the bit line enable signal BL_EN, the column decoder 130 may electrically connect a selected bit line(s) and a selected source line(s) with a write driver and sense amplifier block(s) (refer to FIG. 5). In response to the write enable signal WREN, the column decoder 130 may apply voltages for the write operation to the selected bit line(s) and source line(s).

In response to the read enable signal REN, the column decoder 130 may apply voltages for the read operation to the selected bit line(s) and source line(s). In response to the sensing enable signal SEN, the column decoder 130 may sense a current(s) or a voltage(s) of the selected bit line(s) and source line(s).

In response to the sensing enable delay signal SEND, the column decoder 130 may store (e.g., latch) the current(s) or voltage(s) sensed from the selected bit line(s) and source line(s). The sensing enable delay signal SEND may be called a "latch signal". In response to the equalize signal EQ, the column decoder 130 may discharge voltages of the selected bit line(s) and source line(s).

In nonvolatile memory devices according to certain embodiments of the inventive concept, timing signals to be selected by the second trim signal TRIM2 may be determined depending on timing relationships determined such that the first internal control signals iCS1 and the second internal control signals iCS2 are respectively activated.

Figure 10:
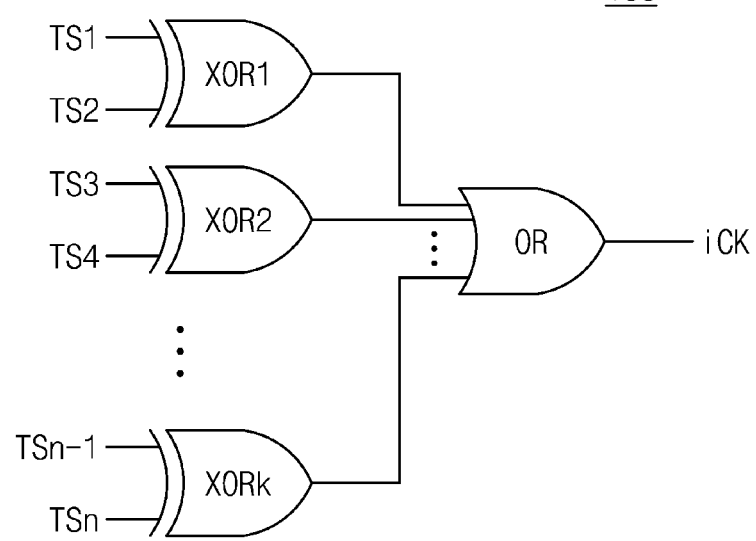
FIG. 10 is a logic circuit diagram further illustrating in one example the internal clock generator 153 of FIG. 1.

FIG. 10 is a logic diagram further illustrating in one example the internal clock generator 153 of FIG. 1. Referring to FIGS. 1, 9, and 10, the internal clock generator 153 may include first to k-th exclusive OR gates XOR1 to XORk (where 'k' is a positive integer and 'n' is equal to 2k), and an OR gate OR.

The first exclusive OR gate XOR1 may perform an XOR operation on the first and second timing signals TS1 and TS2. The second exclusive OR gate XOR2 may perform an XOR operation on the third and fourth timing signals TS3 and TS4. The k-th exclusive OR gate XORk may perform an XOR operation on the (n−1)-th and n-th timing signals TSn−1 and TSn (or (2k−1)-th and 2k-th timing signals TS2k−1 and TS2k).

The OR gate OR may perform an OR operation on outputs of the first to k-th exclusive OR gates XOR1 to XORk. An output of the OR gate OR may be the internal clock signal iCK.

In certain embodiments, the internal clock generator 153 may be activated (e.g., may provide a toggling internal clock signal iCK) during a first-type operation wherein the pump voltage VCP is applied to a selected word line. The internal clock generator 153 may be deactivated (e.g., may provide a fixed-level internal clock signal iCK) during a second-type operation wherein the pump voltage VCP is not applied to the selected word line.

Figure 11:
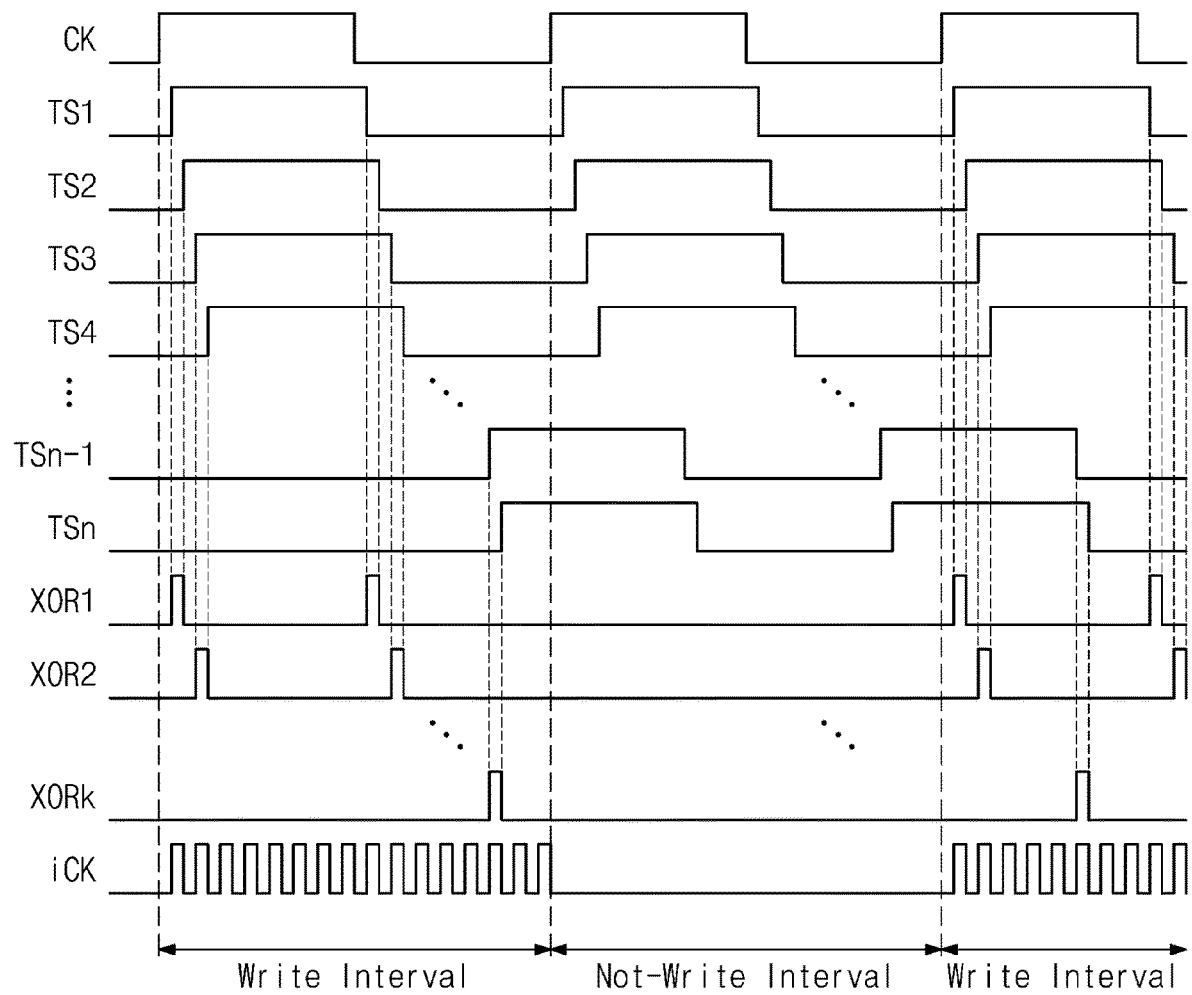
FIG. 11 is a waveform diagram illustrating various relationships between first to n-th timing signals generated from a clock signal and certain internal clock signal(s) generated from the first to n-th timing signals.

FIG. 11 is a waveform diagram illustrating in one example the first to n-th timing signals TS1 to TSn, generated from the clock signal CK, and the internal clock signal iCK, generated from the first to n-th timing signals TS1 to TSn. Referring to FIGS. 1, 9, 10, and 11, the clock signal CK may toggles (i.e., transitions) between a high level and a low level. The delay units "D" of the timing signal generator 151 may sequentially delay the clock signal CK to generate the first to n-th timing signals TS1 to TSn.

During a defined write interval wherein the pump voltage VCP is applied to a selected word line, the first to k-th exclusive OR gates XOR1 to XORk of the internal clock generator 153 may calculate exclusive logical products for two timing signals having a closest relative transition timings. Timing signals that one exclusive OR gate receives and timing signals that another exclusive OR gate receives may be different and may not overlap each other.

The OR gate OR of the internal clock generator 153 may output a logical sum of outputs of the first to k-th exclusive OR gates XOR1 to XORk as the internal clock signal iCK.

During a defined non-write interval wherein the pump voltage VCP is not applied to the selected word line, the internal clock generator 153 may be deactivated. Accordingly, the internal clock signal iCK may have a fixed level.

In an embodiment, during one period (or cycle) of the clock signal CK, 20 periods (or cycles) of the internal clock signal iCK may be generated. A pulse width of the internal clock signal iCK may range from about 0.5 ns to about 1 ns. When the internal clock signal iCK is supplied to the charge pump 154, the pump voltage VCP may reach the target level during 5 to 10 periods (or cycles) of the internal clock signal iCK.

According to embodiments of the inventive concept, the internal clock signal iCK may be variously generated during other first-type operation(s) wherein the pump voltage VCP is applied to a selected word line, not just the write operation.

As described above, the nonvolatile memory device 100 according to an embodiment of the inventive concept may generate the internal clock signal iCK by using the timing signals TS1 to TSn that are used to generate the internal control signals iCS1 and iCS2.

In general, an oscillator configured to generate a clock signal may be used to generate an internal clock signal that is used for a boosting operation of a charge pump. In contrast, in the case of the nonvolatile memory device 100 according to an embodiment of the inventive concept, the internal clock signal iCK may be generated from the timing signals TS1 to TSn used to generate the internal control signals iCS1 and iCS2, instead of using the oscillator. Accordingly, the size of the nonvolatile memory device 100 may be reduced.

In general, a charge pump maintains an enable state to maintain a level of an output voltage at a target level, and an oscillator supplying a clock signal to the charge pump also maintains an enable signal. In contrast, the nonvolatile memory device 100 according to an embodiment of the inventive concept does not use an oscillator and activates the charge pump 154 only when the pump voltage VCP is required. Accordingly, power consumption of the nonvolatile memory device 100 may be reduced.

Figure 12:
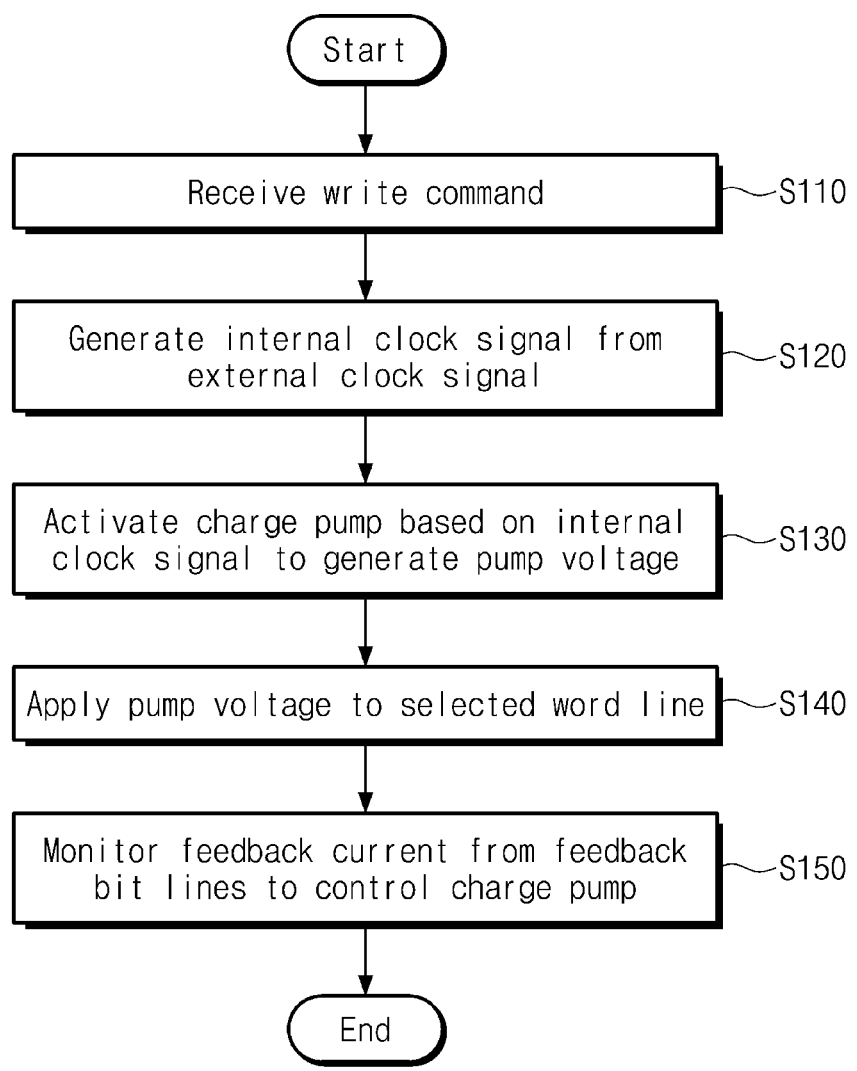
FIG. 12 is a flowchart summarizing in one example a method of operating a nonvolatile memory device according to embodiments of the inventive concept.

FIG. 12 is a flowchart summarizing in one example a method of operating the nonvolatile memory device 100 according to embodiments of the inventive concept. Referring to FIGS. 1 and 12, the nonvolatile memory device 100 may receive a write command (S110). In response, the nonvolatile memory device 100 may generate the internal clock signal iCK from an external clock signal CK (S120).

For example, the nonvolatile memory device 100 may sequentially delay the clock signal CK to generate the timing signals TS. The nonvolatile memory device 100 may generate the internal clock signal iCK by performing exclusive OR operations on selected pairs of the timing signals TS having adjacent transition timings, and performing an OR operation on results of the exclusive OR operations.

Then, the nonvolatile memory device 100 may activate the charge pump 154 in response to the internal clock signal iCK and may generate the pump voltage VCP (S130). The nonvolatile memory device 100 may apply the pump voltage VCP to a selected word line (S140), and the nonvolatile memory device 100 may monitor the feedback currents IFB1 and IFB2 (refer to FIGS. 4 and 5) received from the feedback bit lines FBL1 and FBL2 and may control the charge pump 154 (S150).

According to embodiments of the inventive concept, an output voltage of a charge pump is supplied to feedback cells, and the charge pump is controlled with reference to feedback currents output from the feedback cells. Accordingly, compared to the case where the charge pump is controlled with reference to an output voltage of the charge pump, the reliability of a nonvolatile memory device is improved.

According to embodiments of the inventive concept, a capacitor for stabilization of the output voltage of the charge pump may be omitted from an output terminal of the charge pump. Accordingly, the size of the nonvolatile memory device may be reduced.

According to embodiments of the inventive concept, a clock signal for controlling the charge pump is generated from timing signals for generating internal clocks of the nonvolatile memory device. Accordingly, an oscillator for controlling the charge pump is removed. Hence, the size of the nonvolatile memory device may be reduced.

According to embodiments of the inventive concept, the charge pump of the nonvolatile memory device may be implemented using a one-stage voltage doubler. Accordingly, as compared with analogous devices including a multi-stage charge pump, the size of the nonvolatile memory device may be reduced.

According to embodiments of the inventive concept, the charge pump may be activated only during first-type operations including the write operation. Accordingly, overall power consumption of the nonvolatile memory device may be reduced.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
    a memory cell array including memory cells connected with bit lines and feedback cells connected with feedback bit lines;
    a row decoder connected with the memory cells and the feedback cells through word lines;
    a column decoder connected with the memory cells through the bit lines and connected with the feedback cells through the feedback bit lines; and
    a charge pump that generates a pump voltage provided to a selected word line among the word lines,
    wherein the charge pump is controlled in response to feedback currents flowing through the feedback bit lines.

2. The nonvolatile memory device of claim 1, wherein each of the memory cells includes a selection element connected with a corresponding word line of the word lines and a storage element connected with a corresponding bit line of the bit lines, and
    each of the feedback cells includes a selection element connected with a corresponding word line of the word lines and a corresponding feedback bit line of the feedback bit lines.

3. The nonvolatile memory device of claim 1, wherein the bit lines include first bit lines, second bit lines, and third bit lines, and
    the feedback bit lines include at least one first feedback bit line between the first bit lines and the second bit lines and at least one second feedback bit line between the second bit lines and the third bit lines.

4. The nonvolatile memory device of claim 1, wherein during a first-type operation, each of feedback cells connected with the selected word line from among the feedback cells pass a feedback current corresponding to a level of the pump voltage applied to the selected word line to a corresponding feedback bit line of the feedback bit lines.

5. The nonvolatile memory device of claim 4, wherein the column decoder includes a variable resistor, and feedback currents of the feedback bit lines are transferred to the variable resistor.

6. The nonvolatile memory device of claim 5, wherein the variable resistor is controlled to have a resistance value corresponding to a value obtained by dividing either a least resistance value or a greatest resistance value of the memory cells by a number of the feedback bit lines.

7. The nonvolatile memory device of claim 5, wherein the column decoder further includes:
    a comparator that compares a voltage of the variable resistor with a reference voltage to generate a comparison result, and generates a control signal controlling the charge pump in response to the comparison result.

8. The nonvolatile memory device of claim 7, wherein the control signal controls activation/deactivation of the charge pump.

9. The nonvolatile memory device of claim 1, further comprising:
    a timing signal generator that receives a clock signal and generates timing signals having different transition timings in response to the clock signal;
    an internal signal generator that generates first control signals controlling the row decoder and second control signals controlling the column decoder in response to the timing signals; and
    an internal clock generator that generates an internal clock signal in response to the timing signals and provides the internal clock signal to the charge pump during a first type operation.

10. The nonvolatile memory device of claim 9, wherein the first control signals include a word line enable signal, and the second control signals include a bit line enable signal, a read enable signal, a write enable signal, a sensing enable signal, and a latch signal.

11. The nonvolatile memory device of claim 9, wherein the internal clock generator includes:
    first gates configured to perform an exclusive OR operation on two timing signals having adjacent transition timings from among the timing signals to generate respective operation results; and a second gate configured to perform an OR operation results of the first gates.

12. The nonvolatile memory device of claim 9, wherein during a second-type operation, the internal clock generator deactivates the internal clock signal and outputs a signal having a fixed level.

13. The nonvolatile memory device of claim 1, wherein the column decoder is connected with the memory cells through source lines and is connected with the feedback cells through feedback source lines, and the column decoder includes:
write driver and sense amplifier blocks connected with the bit lines and the source lines; and
voltage switches connected with the feedback source lines and configured to apply a specific voltage to the feedback source lines during a first-type operation.

14. A nonvolatile memory device comprising:
a memory cell array including memory cells connected with bit lines;
a row decoder connected with the memory cells through word lines;
a column decoder connected with the memory cells through the bit lines;
a charge pump configured to generate a pump voltage provided to a selected word line among the word lines;
a timing signal generator configured to generate timing signals having different transition timings in response to a clock signal;
an internal signal generator configured to generate first control signals controlling the row decoder and second control signals controlling the column decoder in response to the timing signals; and
an internal clock generator configured to generate an internal clock signal in response to the timing signals and to provide the internal clock signal to the charge pump during a write operation.

15. The nonvolatile memory device of claim 14, wherein the memory cell array further includes feedback cells connected with the column decoder through feedback bit lines, and the charge pump is controlled in response to feedback currents flowing through the feedback bit lines.

16. The nonvolatile memory device of claim 14, wherein the timing signal generator includes:
delay units connected in series and configured to receive the clock signal and to delay the clock signal to generate the timing signals; and
an amplifier configured to maintain a voltage of a common node of the delay units at a reference voltage.

17. The nonvolatile memory device of claim 14, wherein the internal signal generator includes:
a multiplexer configured to receive the timing signals and to output a timing signal selected from the timing signals in response to a trim signal; and a signal generator configured to output a corresponding control signal of the first control signals and the second control signals in response to the selected timing signal received from the multiplexer.

18. The nonvolatile memory device of claim 14, wherein the charge pump includes:
a switch receiving the internal clock signal;
a first capacitor receiving the internal clock signal through the switch;
an inverter configured to receive the internal clock signal through the switch and to output an inverted internal clock signal;
a second capacitor receiving the inverted internal clock signal from the inverter;
a first transistor connected between a power node to which a power supply voltage is supplied and the first capacitor and having a gate connected with the second capacitor;
a second transistor connected between the power node and the second capacitor and having a gate connected with the first capacitor;
a third transistor connected between an output node from which the pump voltage is output and the first capacitor and having a gate connected with the second capacitor; and
a fourth transistor connected between the output node from which the pump voltage is output and the second capacitor and having a gate connected with the first capacitor.

19. An operating method of a nonvolatile memory device, the method comprising:
receiving a write command;
generating an internal clock signal from an external clock signal in response to the write command;
activating a charge pump in response to the internal clock signal to generate a pump voltage;
applying the pump voltage to a word line selected from word lines connected with memory cells and feedback cells of the nonvolatile memory device; and
monitoring feedback currents from feedback bit lines connected with the feedback cells to control the charge pump.

20. The method of claim 19, wherein the generating of the internal clock signal includes:
sequentially delaying the external clock signal to generate timing signals;
performing an exclusive OR operation on two timing signals having adjacent transition timings from among the timing signals to generate first signals; and
performing an OR operation on the first signals to generate the internal clock signal.

* * * * *